United States Patent [19]

Balaban et al.

[11] Patent Number: 4,686,560
[45] Date of Patent: Aug. 11, 1987

[54] PHASE LOCKED LOOP SYSTEM INCLUDING ANALOG AND DIGITAL COMPONENTS

[75] Inventors: Alvin R. Balaban, Lebanon; Chandrakant B. Patel, Hopewell; Walter H. Demmer, Plainsboro; Leopold A. Harwood, Bridgewater, all of N.J.

[73] Assignee: RCA Corporation, Princeton, N.J.

[21] Appl. No.: 868,567

[22] Filed: May 30, 1986

[51] Int. Cl.$^4$ .......................... H04N 9/45; H04N 9/66
[52] U.S. Cl. .......................................... 358/19; 358/23
[58] Field of Search .................... 358/13, 19, 23, 40

[56] References Cited

U.S. PATENT DOCUMENTS

| | | | |
|---|---|---|---|
| 4,349,833 | 9/1982 | Clarke | 358/23 |
| 4,380,742 | 4/1985 | Hart | 331/1 A |
| 4,476,490 | 10/1984 | Kaneko | 358/148 |
| 4,488,170 | 12/1984 | Nillesen | 358/26 |
| 4,500,909 | 2/1985 | Machida | 358/17 |
| 4,504,799 | 3/1985 | Elmis et al. | 331/1 A |
| 4,625,232 | 11/1986 | Nillesen | 358/23 |

FOREIGN PATENT DOCUMENTS 3432314  3/1986  Fed. Rep. of Germany .

OTHER PUBLICATIONS

Gruen W. J., "Theory of AFC Synchronization", Proceedings of the IRE, Aug. 1953, pp. 1043-1048.

Primary Examiner—John W. Shepperd
Attorney, Agent, or Firm—E. M. Whitacre; P. J. Rasmussen; K. N. Nigon

[57] ABSTRACT

A digital television receiver, having a line-locked clock, includes a partly digital, partly analog phase locked loop. This phase locked loop regenerates two quadrature phase related subcarrier signals that are used to synchronously demodulate the chrominance signal components of the composite video signals into two color informaiton signals. The phase locked loop includes an analog voltage controlled oscillator which generates a signal that is independent of any frequency instability in the line locked clock signal. An analog-to-digital converter digitizes this signal to provide one of the subcarrier signals. This subcarrier signal is applied to a read-only memory to generate the second subcarrier signal. The two color information signals are obtained by multiplying the chrominance signals by the first and second subcarrier signals. A phase comparator determines the phase of the vector sum of the two color information signals and compares this against a desired phase value to generate a phase difference signal. The phase difference signal is filtered and applied to a digital-to-analog converter which provides the frequency control signal for the analog voltage controlled oscillator. In a second embodiment of the invention, a tracking filter is inserted at the output port of the analog-to-digital converter to allow the quantization resolution of the analog-to-digital to be reduced without affecting the performance of the phase locked loop.

6 Claims, 6 Drawing Figures

DISCRETE TIME OSCILLATOR

PHASE LOCKED LOOP SYSTEM INCLUDING ANALOG AND DIGITAL COMPONENTS

The present invention relates to a phase locked loop (PLL) system which produces a digital oscillatory signal. The PLL, which contains both analog and digital components, may be used in digital systems having clock signals which exhibit frequency instabilities.

FIG. 1 shows a typical phase locked loop system. A variable oscillator 10 is responsive to a control signal, C, for generating a variable frequency signal. A phase detector 20 compares the signal provided by the oscillator to a reference signal and generates an output signal that is proportional to the difference in phase between the two signals. This phase difference signal is applied to a low-pass filter 30 which develops the control signal for the variable oscillator. The effect of the control signal is to change the frequency of the oscillator in a sense which tends to reduce the phase difference between the two signals.

A purely digital PLL includes a digital oscillator such as the discrete time oscillator (DTO) shown in FIG. 2A. This oscillator has three components, an adder 210, an accumulator register 220 and a read-only memory (ROM) 230. The value held by the accumulator register is incremented by an input signal IN, coincident with each pulse of clock signal, CK. The values accumulated in the register 220 are applied as addresses to the ROM 230. ROM 230 is programmed to provide digital samples of a periodic output function, for example, a sine wave, as an output signal OUT, in response to address values provided by the accumulator register. Assuming that the register 220 is an M bit register, and that an increment signal, IN, is applied to the DTO. The frequency of the signal provided by the DTO ($f_{DTO}$) may be expressed as:

$$f_{DTO} = (IN/2^M) f_{CK} \quad (1)$$

where $f_{CK}$ is the frequency of the clock signal, CK. An example of the signal V, provided by the accumulator register 220, and the signal OUT, provided by the ROM 230, when $IN/2^M = \frac{1}{4}$ are shown in FIGS. 2B and 2C, respectively.

From the equation (1) it can be seen that the frequency $f_{DTO}$ may change in response to changes in the clock frequency as well as to changes in the value of the input increment signal, IN. When the clock signal applied to the DTO is unstable and the DTO is used in a PLL having a time constant that is too large to track the changing clock frequency, the signal produced by the PLL may exhibit frequency instabilities.

A line-locked digital television receiver is an example of a digital system which may have an unstable clock frequency. A system of this type includes a PLL which develops a clock signal that is locked in phase to the horizontal line synchronizing signal component of the incoming video signals.

When this incoming signal is derived from a nonstandard source, such as a video tape recorder (VTR) or video disc player, the frequency and phase of the horizontal line sychronizing component may vary from line to line. This variation may be caused by stretching of the tape or tape head misalignment in the VTR, disc eccentricity or motor speed fluctuations in either VTR or disc player. The frequency of the clock signal generated by the line locked PLL changes to track variations in the frequency or phase of the horizontal line synchronizing signal. A PLL of this type generally has a relatively short time constant, on the order of ten to fifteen horizontal line periods, for example. This time constant allows the PLL to track the changing line frequency rapidly, to keep the number of samples per line substantially constant throughout a field or frame. This feature is desirable in television signal processing systems which include field or frame store memories.

This tracking feature may cause undesirable color signal distortion in digital video signal processing systems, however. These systems synchronously demodulate the chominance components of the video signals using a regenerated color subcarrier signal that is developed by a digital PLL.

The color subcarrier frequency for nonstandard video signals is relatively stable since it is generated by a crystal controlled oscillator in the VTR or disc player. The color information in the video signal is quadrature amplitude modulated with respect to this color subcarrier frequency to form the chrominance signal components of the composite video signal. To demodulate this chrominance signal, it is desirable for the regenerated subcarrier signal developed by the PLL to be synchronized to the original subcarrier signal in frequency and phase. Since the color subcarrier signal is suppressed in a standard composite video signal, the PLL which regenerates the color subcarrier signal locks to the color reference burst components of the video signals. These components occur only during a small portion of each horizontal line. Consequently, it is desirable for the color subcarrier PLL to accumulate phase errors over a relatively large number of horizontal line periods to ensure that any measured phase error is accurate and less corrupted by noise in the video signal. Thus, the color subcarrier PLL preferably has a much longer time constant than the line locked PLL which generates the system clock signal. This time constant may be on the order of one frame period, for example.

Because of the difference in the loop time constants and because the frequency of the signal produced by the digital color subcarrier PLL depends on the frequency of the line locked clock signal, the combination of the two PLL's may cause instabilities in the regenerated color subcarrier signal. These instabilities in the regenerated color subcarrier signal may, in turn, cause undesirable distortion in the synchronously demodulated color signals.

SUMMARY OF THE INVENTION

The present invention is a phase locked loop which may be used in a digital signal processing system having a clock signal which may exhibit frequency instabilities. The invention includes an analog oscillator which is responsive to a control signal for generating a variable frequency oscillatory signal. An analog-to-digital converter (ADC) develops multi-bit digital samples representing the oscillatory signal at instants in time determined by the clock signal. These digital samples are applied to a phase comparator which compares the digital oscillatory signal to a digital reference signal and provides a digital output signal that is proportional to the difference in phase between the oscillatory and reference signals. This phase difference signal is applied as the input signal to a low-pass filter. The digital output signal of the low-pass filter is applied to a digital-to-analog converter which develops the analog control signal for the analog oscillator. In another aspect of the invention the number of bits, and, so the quantization resolution, of the ADC is reduced and a tracking filter is inserted between the ADC and the phase comparator.

DETAILED DESCRIPTION

Figure 1:
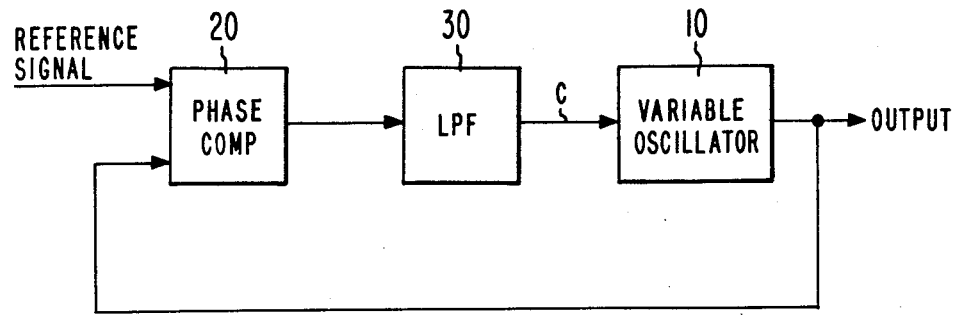
FIG. 1 (prior art) is a block diagram of a phase locked loop.

In the drawings, broad arrows represent busses for multiple-bit parallel digital signals and line arrows represent connections carrying analog signals or single bit digital signals. Depending on the signal processing speed of the devices, compensating delay elements may be required in certain of the signal paths. One skilled in the art of digital circuit design would know where such delays would be needed in a particular system.

Figure 3:
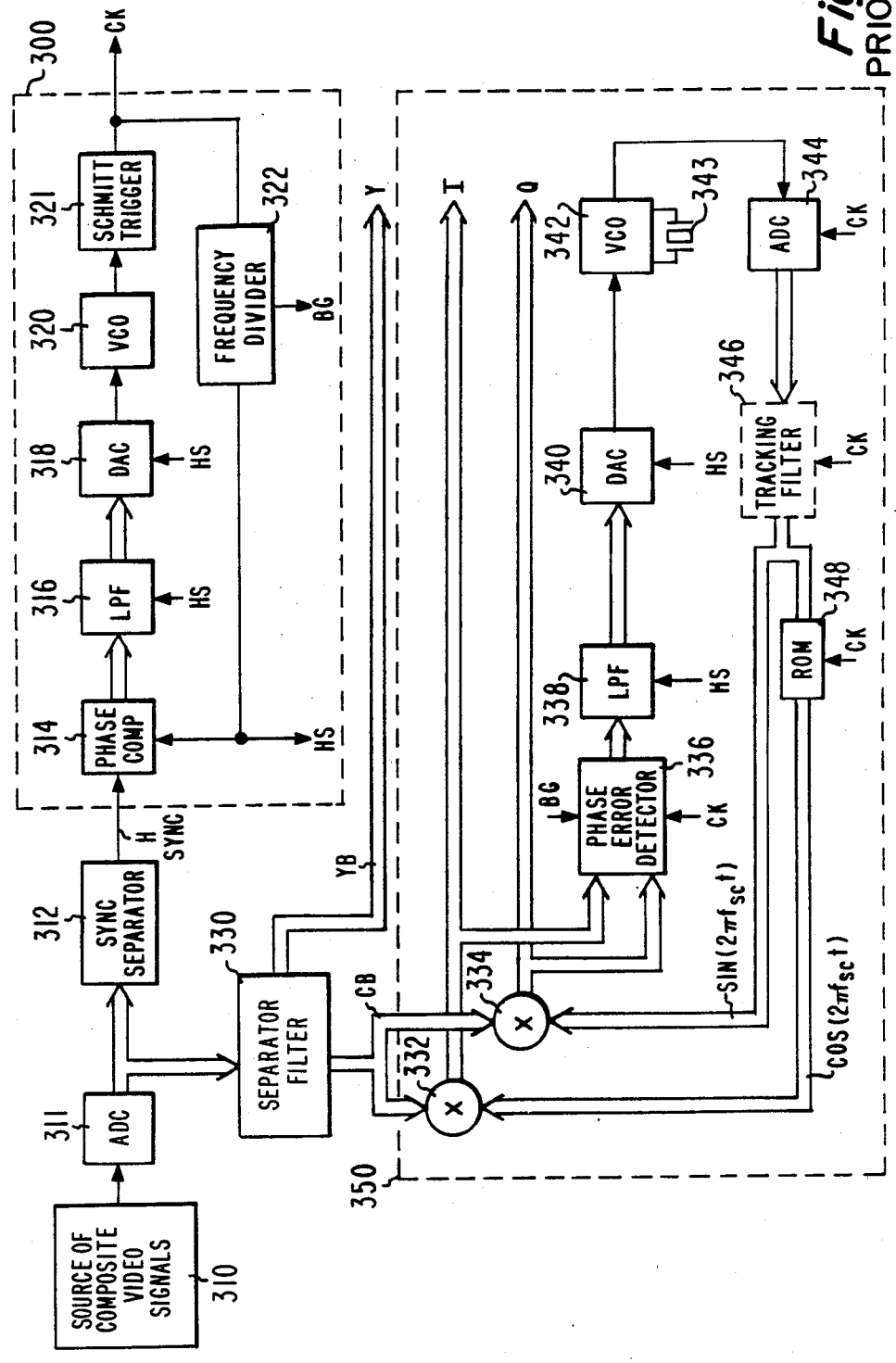
FIG. 3 is a block diagram of a portion of a digital television receiver embodying the present invention.

FIG. 3 is a block diagram of a portion of a television signal processing system which includes two PLL's, 300 and 350. The PLL 300 develops a sampling clock signal, CK, which is phase locked to the horizontal line synchronizing components of the incoming video signals. The PLL 350 is a partly analog and partly digital PLL in which the digital components are clocked by the sampling clock signal CK. PLL 350 develops digital samples representing the color subcarrier reference signal at a predetermined phase, $\phi$, and develops samples of a signal, having a phase of $\phi + 90°$, that is quadrature phase related to this signal. These two signals are used to synchronously demodulate the chrominance signal components of the incoming video signals to develop two quadrature phase related color difference signals.

In FIG. 3, a source of composite video signals 310, which may, for example, include the tuner, IF amplifier and video detector of a conventional digital television receiver, provides composite video signals to an analog to digital converter (ADC) 311. The ADC develops digital samples representing the composite video signals at instants in time determined by a clock signal CK. These digital composite video signals are applied to sync separator circuitry 312. The circuitry 312, for example, develops a signal, HSYNC, representing the horizontal line synchronizing signal component of the composite video signals. The signal HSYNC is applied to one input terminal of a phase comparator 314. An internally generated horizontal line synchronizing signal, HS, is applied to a second input terminal of the phase comparator 314. The circuitry which develops the signal HS is described below. Phase comparator 314, may for example, be similar to the circuitry described in U.S. Pat. No. 4,506,175 entitled "Digital Phase Comparator Circuit Producing Sign and Magnitude Outputs" which is hereby incorporated by reference. The signal provided by the phase comparator 314 may correspond to, for example, the time delay between the leading edges of the respective pulse signals HSYNC and HS. This signal has positive values when the leading edges of the HSYNC pulses occur before the leading edges of the HS pulses and negative values when the leading edges of the HSYNC pulses occur after the leading edges of the HS pulses.

The signal provided by the phase comparator circuitry 314 is applied to a low-pass filter 316. Filter 316 is the loop filter of the PLL 300. The low-pass filtered phase difference signals provided by the filter 316 are applied to a digital to analog converter (DAC) 318. DAC 318 develops analog potential values representing the filtered phase difference signals and applies these values at a horizontal line rate to a voltage controlled oscillator (VCO) 320. The VCO 320, which may be of conventional design, produces the sampling clock signal CK. VCO 320 is tuned to have a free running frequency of approximately R times $f_H$. In the present embodiment, R is the ordinal number of a harmonic of the horizontal line frequency, $f_H$, which approximates a multiple of the color subcarrier frequency. For example, in the NTSC system the frequency, $f_{SC}$, of the color subcarrier signal for standard signals is the 455th harmonic of one-half of the horizontal line frequency, and the frequency, $f_{CK}$, of the sampling clock signal is nominally four times the frequency of the color subcarrier signal. So the VCO used in this embodiment has a free-running frequency of approximately 910 times the horizontal line frequency (R=910).

The output signal of the VCO 320 is applied to Schmitt trigger circuitry 321 which develops a square wave clock signal CK having a frequency, $f_{CK}$, equal to $Rf_H$. The signal CK is applied to frequency dividing circuitry 322. Circuitry 322 divides the frequency of the signal CK by R to develop a signal HS having a frequency substantially equal to $f_H$. As set forth above, the signal HS is applied to the second input terminal of the phase comparator 314.

The circuitry 322 may, for example, include a 10-bit counter (not shown) which is configured to be reset when a count value of 910 is achieved. The frequency dividing circuitry 322 may further include circuit elements (not shown) coupled to the counter to detect count values corresponding to the beginning and end of the burst interval and for generating a burst gate signal, BG, which spans the time interval defined by those count values in each horizontal line period.

The PLL 300 generates a clock signal, CK, which tracks the varying line frequency of a non-standard signal to provide a substantially uniform number of sampling clock pulses from line to line. In the present embodiment, the gain factors of the phase comparator 314, low-pass filter 316, DAC 318, VCO 320, Schmitt trigger 321 and frequency divider circuitry 322 are selected to achieve a filter time constant of approximately 15 horizontal line periods and a damping factor of 2. These gain values depend on the circuit elements to be used in the PLL and may be readily calculated by one skilled in the art of phase-locked loop design. An explanation of the relationship between the gain values, the damping factor and the PLL time constant may be found in Gruen, W. J. "Theory of AFC Synchronization" Proceedings of the IRE, August 1953, pp. 1043-1048, which is hereby incorporated by reference.

Composite video signals from source 310 are also applied to Y/C separator circuitry 330. Circuitry 330 may include, for example, a low-pass filter and a band-pass filter for separating luminance and chrominance band signal components, respectively, from the composite video signals. These luminance and chrominance band signals are available at the output busses YB and CB of the circuitry 330, respectively.

The separated chrominance band signal components are applied to multipliers 332 and 334 which, using signals provided by the PLL 350, demodulate the chrominance signals into two quadrature phase related baseband color difference signals, for example, I and Q.

The color difference signals are applied to a phase error detector 336. The phase error detector 336 may develop, for example, an output signal representing the phase difference between the vector sum of the demodulated signals representing the color reference burst signal and a reference phase value. The phase error detector 336 may include, for example, circuitry (not shown) to separately accumulate baseband I and Q sample values during the burst interval and to divide the accumulated I values by the accumulated Q values to develop values representing the phase of the burst signal relative to the sampling instants of the I and Q samples. These values may be subtracted from a reference value representing the desired burst phase to generate a phase error value to control the PLL 350. The phase error values developed by the detector 336 are applied to a low-pass filter 338 at a rate of one sample per horizontal line period. The low-pass filter 338 is the loop filter of the PLL 350. Filter 338 is clocked by the signal HS generated by the PLL 300.

The filtered phase difference signals provided by the low-pass filter 338 are applied to a DAC 340. DAC 340 is clocked by the signal HS and develops an analog control signal for a VCO 342. The VCO 342, which may be of conventional design, includes a resonant crystal 343 which causes the VCO 342 to have a free-running frequency substantially equal to the color subcarrier frequency, $f_{SC}$. Under the control of the filtered phase difference signal provided by the DAC 340, the VCO 342 provides a regenerated subcarrier signal which changes frequency to track changes in the phase relation between the demodulated I and Q color difference signals during the burst interval. The regenerated subcarrier signal provided by the VCO 342 is digitized by an ADC 344 which is clocked by the sampling clock signal CK. In the first embodiment of the invention, the ADC 344 provides eight-bit samples representing the regenerated color subcarrier signal which are applied directly to a multiplier 334 and to a ROM 348. The tracking filter 346 (shown in phantom) is not used in this embodiment. The ROM 348, which is clocked by the sampling clock signal CK, converts the digital signal provided by the ADC 344, which may be represented by the expression SINE $(2\pi f_{SC}t)$ into a quadrature phase related digital signal which may be represented by the expression COSINE $(2\pi f_{SC}t)$. The signal provided by the ROM 348 is applied to the multiplier 332. The multipliers 332 and 334 multiply the chrominance signals provided by the Y/C separator 330 by the quadrature phase related signals provided by the ROM 348 and ADC 344, respectively, to provide the respective baseband I and Q color difference signals.

Since the frequency of the regenerated subcarrier signal provided by the VCO 342 is substantially independent of the clock signal, CK, the I and Q color difference signals provided by the multipliers 332 and 334 are substantially free of distortion related to the frequency instabilities in the clock signal, CK. This reduced distortion is achieved by virtue of the DAC 340 and ADC 344 included in the PLL system. In the embodiment of the invention described above, the DAC 340 converts the four most significant bits (MSB's) of the signal provided by the low-pass filter 338 into the analog control signal for the VCO 342 and the ADC 344 converts the regenerated subcarrier signal provided by the VCO 342 into eight-bit digital samples.

In a second embodiment of the invention, the quantization resolution of the ADC 344 is reduced, for example, from eight-bits to four-bits by inserting a tracking filter 346 between the ADC 344 and the multiplier 334 and ROM 348. The tracking filter 346 increases the resolution of the sinusoidal signal from four to eight significant bits while accurately tracking the changes in phase and frequency. Since a four-bit ADC uses only 16 comparators as opposed to 256 comparators for an eight-bit ADC, this second embodiment of the invention may be more cost effective.

As used herein, the term "tracking filter" means a filter having a frequency response characteristic that has a substantially fixed bandwidth and a variable center frequency.

Figure 4:
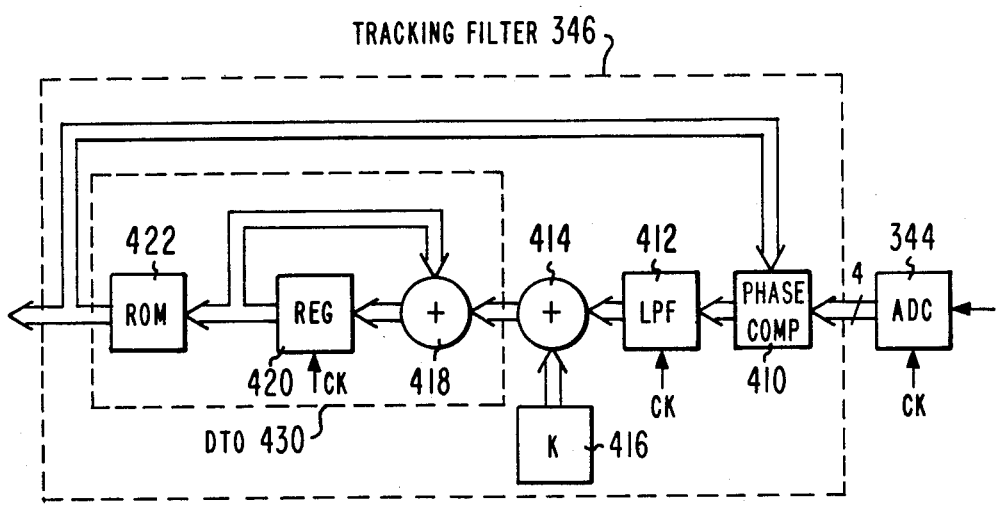
FIG. 4 is a block diagram of a tracking filter which may be used in the portion of the digital television receiver shown in FIG. 3.
Figure 2A:
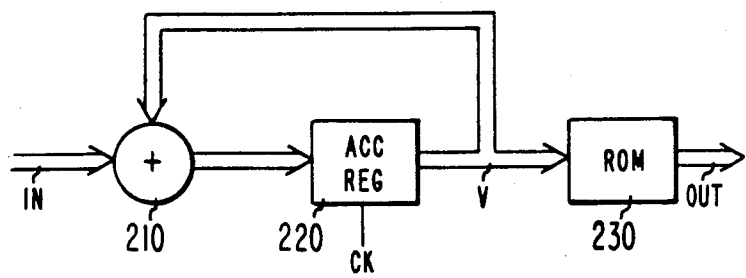
FIG. 2A (prior art) is a block diagram of a digital oscillator which may be used in the phase locked loop shown in FIG. 1, and FIGS. 2B and 2C are waveform diagrams useful in explaining the operation of the digital oscillator.
Figure 2B:
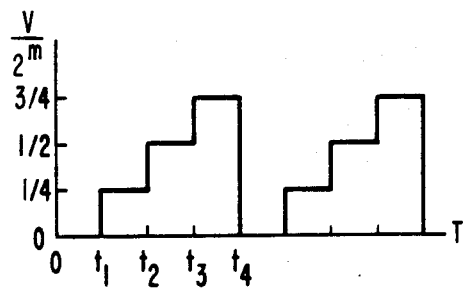
Figure 2C:
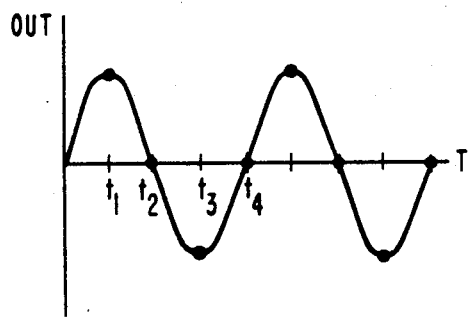

FIG. 4 is a block diagram of a digital PLL which may be used as the tracking filter 346. Four bit digital samples representing the analog signal provided by the VCO 342 are applied to one input port of a phase comparator 410. The phase comparator 410, which may, for example, be a conventional four-bit multiplier, compares these samples with the four MSB's of the output signal of the PLL, provided by a ROM 422. The output signal of the phase comparator 410 is a digital signal representing the difference in phase between the output signal of the tracking filter 346 and the reference signal provided by the ADC 344. This phase-difference signal is applied to a filter 412 which is the loop filter of the PLL. The filter 412 exhibits a low-pass frequency response characteristic over the band of frequencies occupied by the signal provided by the phase comparator 410. The filtered phase-difference signal provided by the filter 412 is coupled to an adder 414 wherein it is added to a fixed increment value, K, provided by a digital value source 416. The digital signal developed by the adder 414 is applied as the input increment signal to a DTO 430. The DTO 430 operates in the same manner as the DTO described in reference to FIGS. 2A–2C. The input increment signal is accumulated in the register 420 by repeatedly adding the input increment to the contents of the register 420, in the adder 418. Since the register 420 has a fixed number of bits, it periodically overflows and so produces a periodic output signal corresponding to a sawtooth waveform. This output signal is applied to a ROM 422 which is programmed to provide, for example, the sine of the address values developed by the register 420 normalized to $2\pi$ radians. The ROM 422 provides a digital signal having eight-bits of resolution. As set forth above, the four MSB's of this signal are applied to an input part of the phase comparator 410 to complete the feedback loop.

In the example presented above, the register 420 may be, for example, a twenty bit register and the value K may be, for example $2^{18}$ or 262,144. The values provided by the low-pass filter 412 in this embodiment of the invention are normalized so that the MSB of the filtered phase difference values correspond to the digital value $2^{17}$.

In the present embodiment, the gain factors of the various component parts of the digital PLL are chosen to achieve a loop time constant of approximately 15 horizontal line periods. This time constant is sufficient to allow the PLL to track phase and frequency changes in the signal provided by the ADC 344 as well as any frequency instabilities in the signal provided by the DTO 430 which may be related to the clock signal CK. Moreover, this time constant is long enough to accumulate a sufficient number of the four-bit samples provided by the ADC 344 to develop an output signal having an eight-bit quantization resolution.

What is claimed is:

1. In a digital signal processing system including a source of clock signal which may exhibit frequency instabilities, a phase locked loop system comprising:
    an analog variable oscillator which is responsive to an analog control signal for generating a variable frequency oscillatory signal;
    digitizing means including an analog-to-digital converter coupled to said oscillator for generating a digital signal including N-bit digital samples representing said oscillatory signal at instants in time determined by said clock signal, where N is an integer greater than 1;
    phase comparison means coupled to said analog-to-digital converter for generating a digital signal that is proportional to the difference in phase between the signal generated by said digitizing means and a reference signal; and
    digital-to-analog converting means, responsive to the digital signals generated by said phase comparison means, for generating said analog control signal, said analog control signal conditioning the variable oscillator to change the frequency of said oscillatory signal in a sense tending to cause the signals provided by said phase comparison means to converge to a predetermined value.

2. The phase locked loop system set forth in claim 1 wherein said digitizing means further includes a tracking filter coupled to said analog-to-digital converter and responsive to the signals provided thereby for developing a further digital signal representing said oscillatory signal and having a finer quantization resolution than the signal provided by said analog-to-digital converter, wherein said further digital signal is the output signal of said digitizing means.

3. The phase locked loop system set forth in claim 2 wherein said tracking filter includes a digital phase locked loop comprising:
    a digital oscillator responsive to said clock signal and to a frequency control signal for developing a digital signal having substantially the same frequency as the signal provided by said analog-to-digital converter and including M-bit digital samples, where M is an integer greater than N;
    phase comparison means coupled to said digital oscillator and to said analog-to-digital converter for developing a signal proportional to the difference in phase between the respective signals provided thereby; and
    a low-pass filter coupled to said phase comparison means for integrating the phase difference signal provided thereby to develop said frequency control signal for said digital oscillator;
    wherein said digital phase locked loop has a time constant sufficient to track any phase changes in the oscillatory signal provided by the digital oscillator that are related to frequency instabilities in the clock signal.

4. In a digital video signal processing system including a source of clock signal which may exhibit frequency instabilities and a source of digital chrominance signals including a color reference burst signal component, apparatus for demodulating said chrominance signals into first and second quadrature phase related color difference signals, comprising:
    an analog variable oscillator responsive to a control signal for developing a variable frequency oscillatory signal wherein the frequency of said oscillatory signal is substantially independent of said clock signal;
    digitizing means including an analog-to-digital converter coupled to said analog oscillator for developing a first digital signal including plural-bit digital samples representing said oscillatory signal at instants in time determined by said clock signal;
    means coupled to said digitizing means for developing a second digital signal having substantially the same frequency as, and being quadrature phase related to said first digital signal;
    first and second signal multiplying means coupled to receive said digital chrominance signals at respective first input ports and said first and second digital signals at respective second input ports for providing said first and second color difference signals at respective output ports;
    phase detecting means coupled to said first and second signal multiplying means for developing a signal proportional to the difference between the phase of the vector sum of the components of said first and second color difference signals corresponding to said color reference burst signal and a reference phase value;
    means coupled to said phase detecting means and including a digital-to-analog converter responsive to said phase difference signal for developing said control signal for said analog variable oscillator to change the frequency of said oscillatory signal in a sense which reduces the amplitude of said phase difference signal.

5. The apparatus set forth in claim 4 wherein said digitizing means further includes a tracking filter coupled to said analog-to-digital converter and responsive to the signals provided thereby for developing said first digital signal representing said oscillatory signal, having a finer quantization resolution than the signal provided by said analog-to-digital converter, wherein said further digital signal is the output signal of said digitizing means.

6. The apparatus set forth in claim 5 wherein said tracking filter includes a digital phase locked loop comprising:
    a digital oscillator responsive to said clock signal and to a frequency control signal for developing a digital signal having substantially the same frequency as, and a larger number of bits per sample than the signal provided by said analog-to-digital converter;
    phase comparison means coupled to said digital oscillator and to said analog-to-digital converter for developing a signal proportional to the difference in phase between the respective signals provided thereby; and
    a low-pass filter coupled to said phase comparison means for integrating the phase difference signal provided thereby to develop said frequency control signal for said digital oscillator;
    wherein said digital phase locked loop has a time constant sufficient to track any phase changes in the oscillatory signal provided by said digital oscillator that are related to frequency instabilities in the clock signal.

* * * * *

UNITED STATES PATENT AND TRADEMARK OFFICE
CERTIFICATE OF CORRECTION

PATENT NO. : 4,686,560

DATED : August 11, 1987

INVENTOR(S) : Alvin R. Balaban et al.

It is certified that error appears in the above-identified patent and that said Letters Patent is hereby corrected as shown below:

In Figure 3, delete the legend "PRIOR ART".

Signed and Sealed this

Twenty-third Day of February, 1988

Attest:

DONALD J. QUIGG

*Attesting Officer*     *Commissioner of Patents and Trademarks*